United States Patent [19]

Stanton

[11] Patent Number: 5,684,566
[45] Date of Patent: Nov. 4, 1997

[54] ILLUMINATION SYSTEM AND METHOD EMPLOYING A DEFORMABLE MIRROR AND DIFFRACTIVE OPTICAL ELEMENTS

[75] Inventor: Stuart T. Stanton, Coplay, Pa.

[73] Assignee: SVG Lithography Systems, Inc., Wilton, Conn.

[21] Appl. No.: 449,005

[22] Filed: May 24, 1995

[51] Int. Cl.⁶ .............................. G03B 27/72; H01L 21/30
[52] U.S. Cl. .............................. 355/67; 355/68; 355/71
[58] Field of Search .............................. 355/67, 68, 69, 355/53, 52; 430/4, 5; 359/290

[56] References Cited

U.S. PATENT DOCUMENTS

| | | | |
|---|---|---|---|
| 4,091,274 | 5/1978 | Angelbeck et al. | 250/201 |
| 4,516,832 | 5/1985 | Jain et al. | 350/96.24 |
| 4,619,508 | 10/1986 | Shibuya et al. | 353/122 |
| 4,773,748 | 9/1988 | Shih | 350/611 |
| 4,918,583 | 4/1990 | Kudo et al. | 362/268 |
| 4,939,630 | 7/1990 | Kikuchi et al. | 362/268 |
| 4,994,580 | 2/1991 | MacDonald et al. | 350/611 |
| 5,237,367 | 8/1993 | Kudo | 355/67 |
| 5,245,384 | 9/1993 | Mori | 355/67 |
| 5,296,892 | 3/1994 | Mori | 355/67 |
| 5,300,971 | 4/1994 | Kudo | 355/67 |
| 5,320,918 | 6/1994 | Raab et al. | 430/4 |
| 5,479,289 | 12/1995 | Fisli | 359/290 |
| 5,482,818 | 1/1996 | Nelson | 430/394 |

FOREIGN PATENT DOCUMENTS 62-34460   2/1987   Japan .

*Primary Examiner*—Arthur T. Grimley
*Assistant Examiner*—David A. Lane
*Attorney, Agent, or Firm*—Fattibene and Fattibene; Paul A. Fattibene; Arthur T. Fattibene

[57] ABSTRACT

An illumination system for use in photolithography using a laser or radiation beam source. A deformable mirror is used to shape the beam of laser radiation to obtain global uniformity. A profile sensing means is used to detect any global non-uniformities. The output of this sensing means is fed to a controller for calculating a mirror contour and controlling actuators that shape the deformable mirror to obtain a globally uniform intensity. A diffractive or diffusive optical element, such as a microlens array, eliminates local non-uniformities. Movement of this element eliminates speckle caused by interference due to the coherent beam source. A uniform intensity profile and appropriate angular spread is achieved with very little transmission loss and is automatically compensated for degraded or changing source performance. The illumination system is particularly applicable to a scanning photolithography process as used in the manufacture of semiconductor substrates.

23 Claims, 14 Drawing Sheets

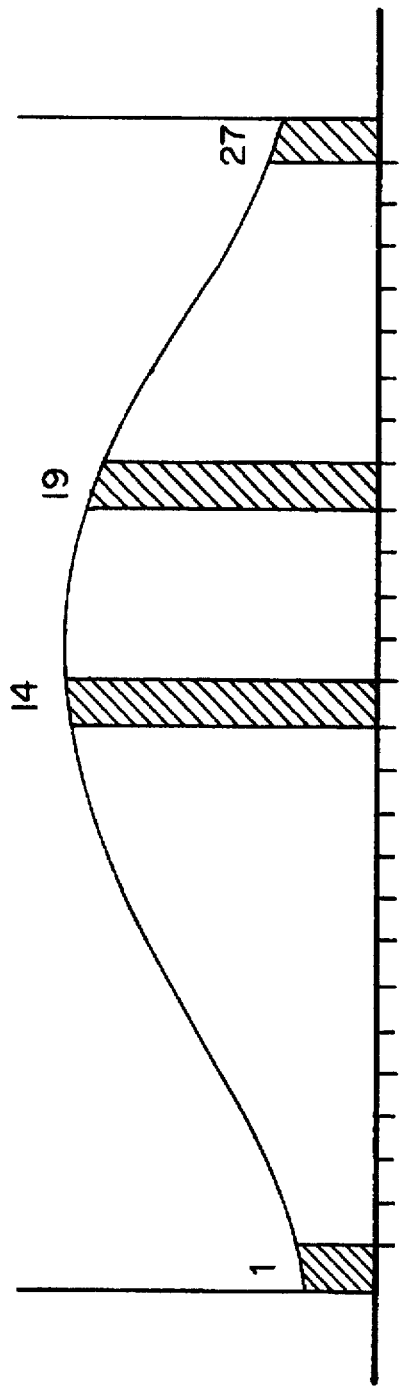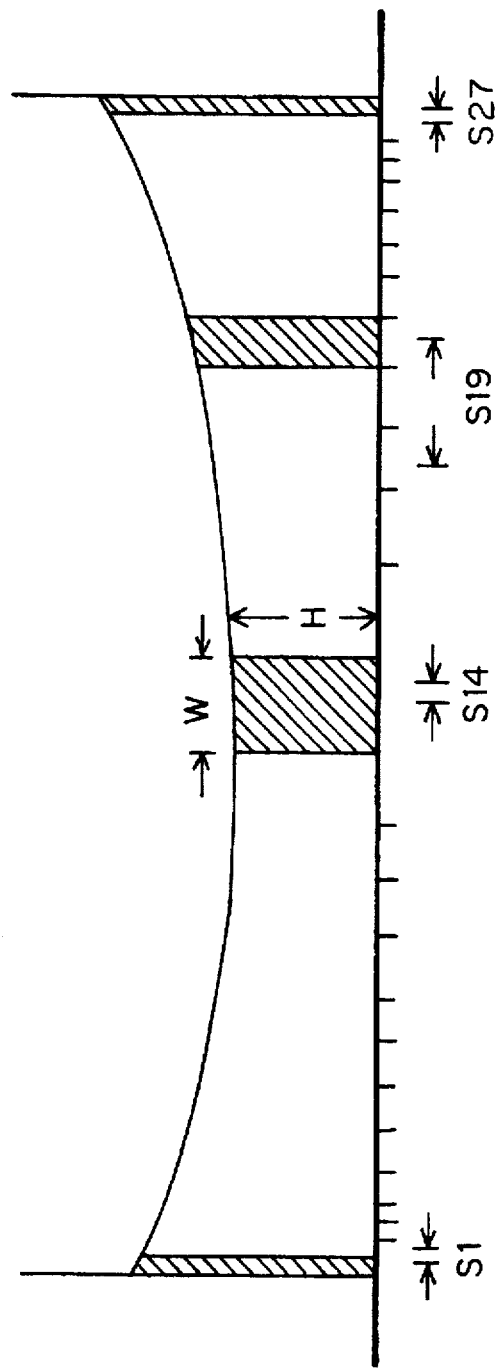

ILLUMINATION SYSTEM AND METHOD EMPLOYING A DEFORMABLE MIRROR AND DIFFRACTIVE OPTICAL ELEMENTS

GOVERNMENT INTEREST

The United States Government may have certain rights in the present invention pursuant to Contract No. F19628-90-C-002 awarded by the Department of Defense.

FIELD OF THE INVENTION

The present invention relates generally to an illumination system and methods for adjusting illumination profile. In particular, the present invention relates to an illumination system and method employing a deformable mirror and diffusive or diffractive element(s) to adjust the illumination profile emanating from an illumination source. One suitable application for the invention is adjusting the illumination profile of a laser illumination system in step and scan photolithography.

BACKGROUND OF THE INVENTION

Photolithography is commonly used for manufacturing semiconductors and flat panel displays. In photolithography, an illumination source transmits electromagnetic radiation through the openings in a reticle or mask. This defines an image which is projected on a substrate coated with photo-sensitive material. The illumination profile of a given illumination source is a map of the intensity of electromagnetic radiation impinging on a target, for example, the substrate, as a function of location thereon. To properly expose the substrate, the illumination profile should be relatively uniform.

In the past, the feature size of integrated circuits was relatively large and could be obtained with several choices of well behaved illumination sources. A number of suitable illumination sources could be used in the blue visible, ultraviolet (UV), and deep UV (e.g., 248 nm) regions.

As the semiconductor industry reduced feature size, designers were forced to use illumination sources producing smaller wavelengths to avoid diffraction-based resolution limits. However, at the smaller wavelengths, there are a limited number of suitable lamps which can deliver sufficient energy. The alternate laser or radiation beam sources in these wavelengths tend to have a poor output profile or instability characteristics. These drawbacks are exacerbated by the generally poor performance of optical material in this wavelength region.

Designers have sought to address these problems by adding complex optical systems between the illumination source and the substrate. The optical systems used, however, to compensate for nonuniform illumination profiles have involved anamorphic designs resulting in inefficient transmission and high manufacturing costs. An anamorphic optical system is one which has a different power or magnification in one principal meridian than in the other. See Smith, *Modern Optical Engineering* pages 270–273 (1990). U.S. Pat. No. 4,619,508 to Shibuya et al. describes one such illumination system which forms an incoherent light source from a coherent light beam. U.S. Pat. No. 4,918,583 to Kudo et al. describes another illumination system having an internal reflection type integrator in combination with a fly-eye type integrator and a plurality of lens elements.

In general, the optical systems associated with conventional illumination systems use a large number of refractive optic lens elements. This results in potentially high absorption of the radiation and low output reaching the substrate. For lens or lens-like elements in a complex illuminator, the losses may vary laterally adding to the non-uniformity of the illumination profile. In addition, in the smaller wavelengths, such as in the deep UV region, there are a limited number of refractive materials that have acceptable transmission or have a long life without optical degradation. Further, high quality refractive materials for x-ray optics are essentially nonexistent and many x-ray exposure tools must perform without refractive elements.

In an attempt to reduce lithographic resolution, some designers have employed lasers having a wavelength at 193 or 248 nanometers for the illumination sources, or x-ray radiation sources projecting a beam-like pattern. Here also, there are disadvantages. For example, an illumination profile of an excimer laser is often not uniform. Further, the laser's intensity profile can change from thermal changes, gas aging, and discharge dynamics, among other variables. In many laser based illumination systems, the associated optics can degrade causing the illumination profile to change over time. Furthermore, the optical designs which attempt to provide improved uniformity on the reticle may compromise the desired angular illumination properties.

Accordingly, attempts to provide optimum illumination with high energy delivery to the substrate in the deep UV region or even smaller wavelength regions have had limited success. There is a need to solve the problems associated with existing illumination systems and take a new approach in the design of systems employing relatively coherent light sources such as lasers and/or substantially directional electromagnetic radiation sources at the smaller wavelengths.

FIG. 1A shows the distinction between the root features of many prior illumination concepts and the present concept. The prior concepts generally utilized a Kohler condenser lens approach to providing a uniform field. In FIG. 1A, a conventional fly's eye lens 100 and a condenser lens 101 is shown illuminating a reticle 30. The current concept will be shown to be advantageous in that it does not need such a lens or lens system.

SUMMARY OF THE INVENTION

The present invention provides a stable uniform illumination profile for projecting an image onto a target substrate, reduces transmission losses, and thereby increases the radiation reaching the substrate. The present invention eliminates the speckle or unwanted coherent patterns in the imagery of the mask, and compensates for fluctuation over time of the illumination profile.

In one embodiment, the present invention provides an illumination system, including an electromagnetic radiation source, a deformable mirror spaced apart from the source, a plurality of actuators to change the contour of the mirror, a diffractive element prior to the reticle, a detector for detecting the profile emitted from the source and producing an output signal, and a controller receiving the output signal, calculating the desired contour, and controlling the actuators so that the deformable mirror changes the illumination profile in a predetermined manner.

In another embodiment, the present invention provides a detector comprising a beamsplitter and a camera based profiler. The beamsplitter reflects part of the radiation emitted from the radiation source to the profiler. The profiler determines the global uniformity of the radiation emitted by the radiation source and produces an output signal to the controller. In response, the controller selectively activates actuators to deform the mirror in desired locations. Thus, the actuators adjust the deformable mirror to achieve a desired change in the illumination profile at the substrate.

In still another embodiment, the present invention provides a diffractive element, for example, a microlens array, which functions as a tailored diffusive element generating local uniformity, incoherent summing, angular spread, and telecentricity. Acceptable telecentricity refers to acceptable image distortion due to small defocus. A very uniform, stable illumination profile can be thereby obtained with very low transmission losses.

In another embodiment, the invention uses at least one diffusive or diffractive optical element and, preferably, the diffusive element can be moved or oscillated in a single plane.

Accordingly, it is an object of the present invention to provide a stable uniform illumination profile for projecting the image of a reticle onto a semiconductor wafer.

It is another object of the present invention to increase throughput and reduce transmission losses.

It is an advantage of the present invention that interference of coherent wavefronts is reduced, eliminating speckle.

It is another advantage of the present invention that fluctuation over time of the laser source profile is compensated for.

It is yet another advantage of the present invention that reduced cost and maintenance are achieved.

It is a feature of the present invention that a deformable mirror is used.

It is another feature of the present invention that at least one diffractive optical element is used.

It is yet another feature of the present invention that the diffractive optical element is moved or oscillated in a single plane.

These and other objects, advantages, and features will be readily apparent in view of the following detailed description.

BRIEF DESCRIPTION OF THE DRAWINGS

FIG. 1D shows profile division into segments.

FIG. 1E shows re-assembly of segments to obtain a new profile.

DETAILED DESCRIPTION OF THE PREFERRED EMBODIMENTS

Figure 1:
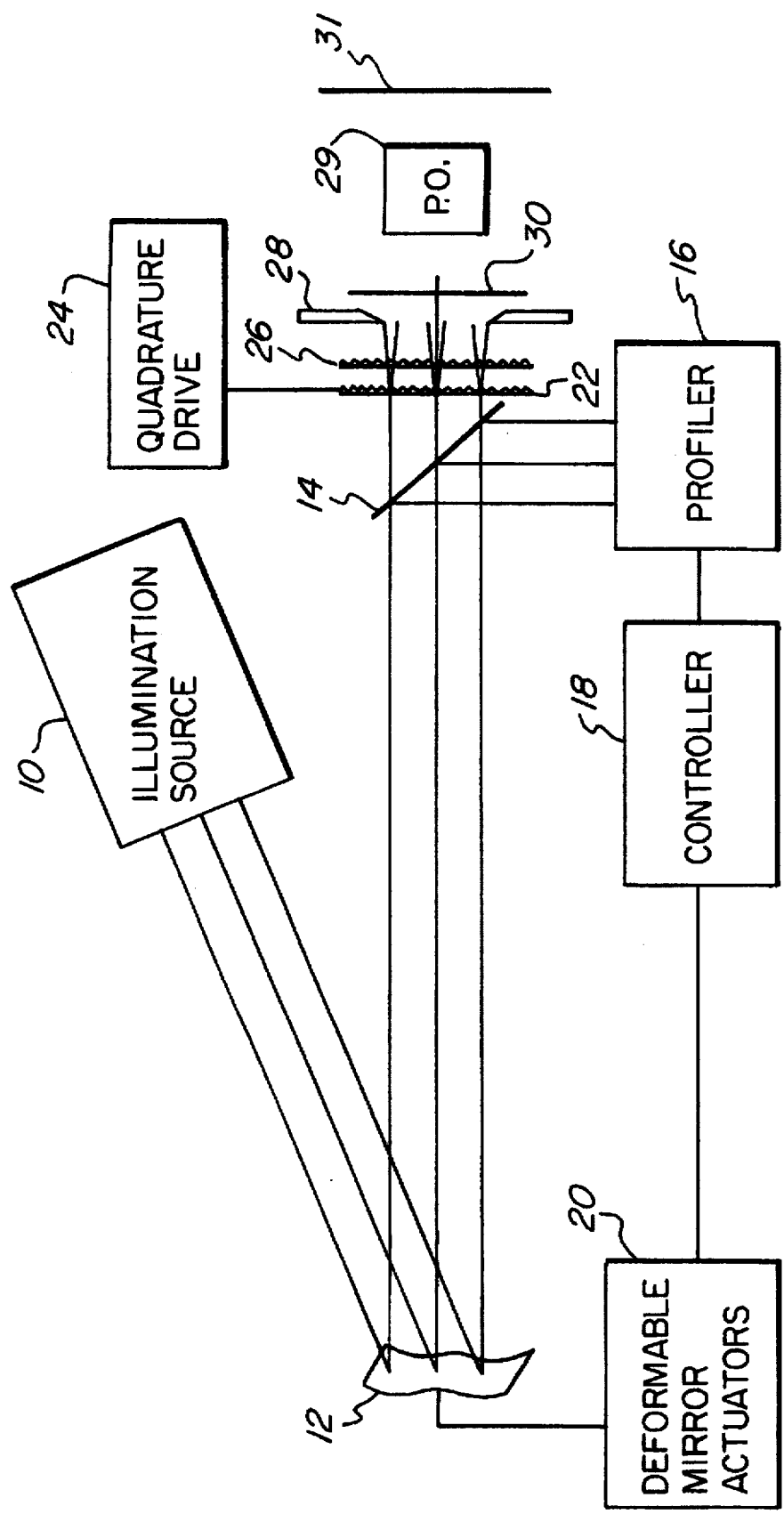
FIG. 1 is a schematic representation of an embodiment of the system of the invention.
Figure 1A:
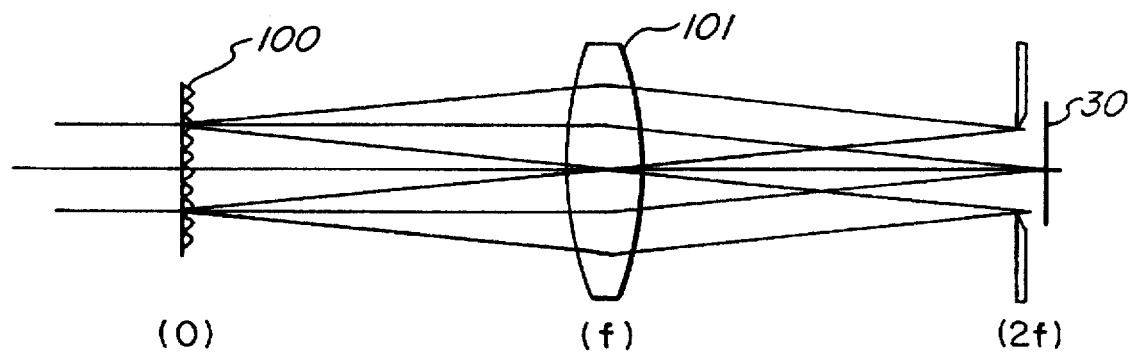
FIG. 1A is a comparison to the Kohler condenser lens scheme in many prior illuminators.

FIG. 1 is a diagram of a system of the present invention. In one embodiment, the system includes an illumination source 10 projecting electromagnetic radiation onto a deformable mirror 12. A profiler 16 detects the radiation reflecting off the mirror 12 and sends a signal indicative thereof to a controller 18. The controller 18 sends corresponding signals to a plurality of actuators 20 to change the contour of the mirror 12 to generate a desired illumination profile. The resulting radiation then proceeds through the openings of a mask 30, through projection optics 29 onto a target substrate 31.

The illumination source 10 can be any suitable substantially directional radiation source. In one embodiment, the illumination source 10 projects a beam of substantially directional, short wavelength electromagnetic radiation. Favorable results have been achieved, for example, when using an excimer laser for the illumination source 10. A suitable excimer laser operating at 193 nm or 248 nm can be purchased from Cymer Laser Technologies of San Diego, Calif. or from Lambda Physik Inc. of Acton, Mass., such as Cymer Model No. ELS-4000 or Lambda Physik Model No. Litho.

For purposes of illustrating the invention, the illumination source 10 will be assumed to not have a uniform intensity profile. As shown in FIG. 1, radiation from the illumination source 10 is reflected off the deformable mirror 12. The mirror 12 may be made of zerodur or a common microscope slide substrate of roughly 1 mm thickness and polished flat to about 0.2 microns for the deep UV region. A suitable deep UV reflective coating may be obtained from Rocky Mountain Instruments, Longmont, Colo. The mirror 12 has a deformable surface that can be used to change the illumination profile of radiation from the source 10.

Figure 1B:
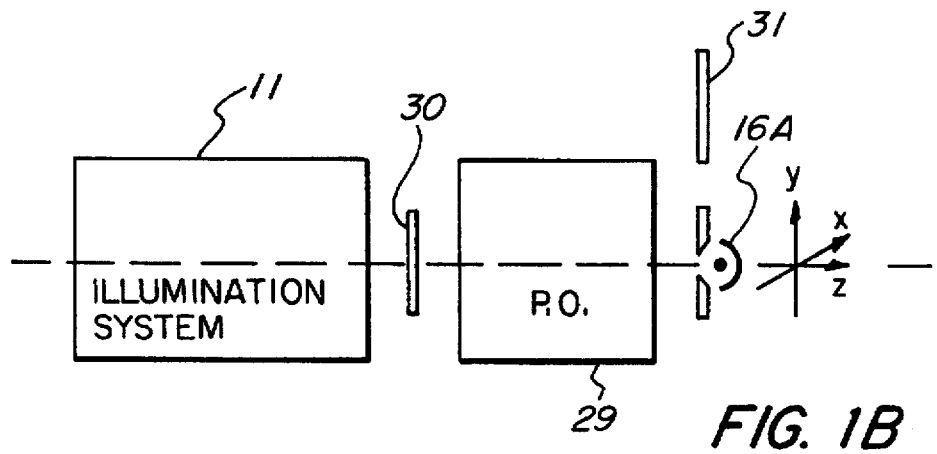
FIG. 1B illustrates the use of a scanning detector for profile sensing.
Figure 1C:
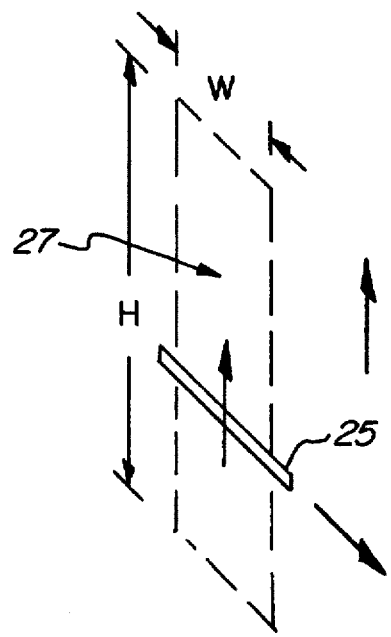
FIG. 1C illustrates a rectangular field scanned by a slot.

The system provides means for sensing the illumination profile of the radiation emanating from the illumination source 10. The sensing means can be placed anywhere in the optical path of the system as long as the illumination profile can be readily obtained. For example, a movable silicon photodiode detector 16A, as shown in FIG. 1B, can be placed in the plane of the substrate 31 and moved out of the way when substrate 31 is to be exposed. FIG. 1C illustrates a one-dimensional integral profile measurement, I(y). A detector 16A, illustrated in FIG. 1B, lies behind a slot aperture 25 which scans across the rectangular field 27. Light is summed along the slot 25, producing an integral of the two dimensional profile.

In the embodiment shown in FIG. 1, the sensing means comprises a beamsplitter 14 and a profiler 16. The beamsplitter 14 is in the optical path of the radiation reflected off the mirror 12. The beamsplitter 14 can be any suitable structure, including an optic grade mirror with a partially reflective coating or an optic grade beamsplitter cube. One suitable beamsplitter can be purchased from Rocky Mountain Instruments of Longmont, Colo.

Preferably, a small portion of the reflected radiation from the source 10 is directed to the profiler 16. The profiler 16 acts as a camera to detect the spatial distribution of intensity or illumination profile of the radiation reflected from the mirror 12 and beamsplitter 14.

The output of the profiler 16 is sent to a controller 18, for example, in an RS-170 video format, but many other formats are possible. In one preferred embodiment, the controller 18 includes a programmable computer. The controller 18, based on information from the profiler 16, calculates the surface contour of the mirror 12 to achieve a desired illumination profile, for example, a uniform illumination profile. The controller 18 sends corresponding digital signals to the mirror actuators 20. A plurality of mirror actuators 20 are operably coupled to the mirror 12 and adjust the surface contour of the mirror 12 in accordance with the signals sent by controller 18 to obtain the desired illumination profile at the target plane, for example, at the substrate 31.

The controller 18 can use any of a number of different calculation techniques or algorithms to calculate the desired surface contour of the mirror 12. Typically, the surface contour desired will result in a uniform intensity profile at the substrate; however, other illumination profiles are obtainable. In another embodiment, the controller 18 uses trial-and-error and feedback to calculate the surface contour resulting in the best globally uniform radiation intensity.

Whatever algorithm is used, it is highly desirable that any change in surface contour of the mirror 12 be minimized to only that necessary to obtain the desired result, for example, a uniform illumination profile. This eliminates unnecessary excess mirror strain and beam decollimation.

One algorithm, applicable to the one-dimensional case to accomplish this goal, includes the step of dividing the illumination profile data into a number of equal area segments. Typically, several hundred segments will be used. The equal area segments will typically contain different quantities of energy.

The target illumination profile, usually a constant rectangular function, is obtained by varying the width of a corresponding area segment of the target illumination profile as required by the radiation intensity needed over the segment. This is shown in FIGS. 1D and 1E. The radiation energy or area under the profile curve of each corresponding segment is therefore constant, but the height and width of the curve segment will differ.

The new set of varying width segments are stacked in the original sequence of division of the profile to obtain a new profile data set. This determines the segment displacements ($S_i$) that should be created by the deformation of the mirror 12. In this way, the minimum lateral shifting of radiation from relative high profile points to relative low is obtained, and radiation is never shifted in a way that results in the crossing of rays. The computed surface of the mirror is that which has local slopes according to the law of reflection, generating reflected ray angle changes which obtain the desired segment shifts. As a result, a minimum surface deformation of the mirror 12 is obtained for the desired globally uniform illumination profile. This is minimum because segment shifts obtained this way require minimum mirror slope. See FIGS. 1F, 1G, 1I, and 1J.

The deformable mirror 12 has practical constraints on deformation due to the finite displacement range of the actuators 20 along with the material flexure limits of the mirror 12 itself. Flexure limits will arise from either breakage of mirror 12 or the resistance of the mirror 12 to movement of the actuators 20.

Preferably, the angular size of the deformation of the mirror 12 will have a negligible effect on downstream decollimation of the radiation used in the exposure of the substrate 31. The beam projected to the diffractive element will remain substantially directional due to the small angular deviation applied to it. This is required if the telecentricity of the illumination of the reticle depends on collimation. Accordingly, it is important to find the minimum deformation of the surface of mirror 12 which alters a given profile emanating from illumination source 10 to create a new illumination profile at the substrate 31.

A profile data set is divided into a large number of equal segments, not necessarily related to the number of actuators 20. The number of segments used is ultimately a matter of computational accuracy. However, at least several hundred segments should be used for typical ±1% uniformity goals. The data is numerically integrated in order to establish the amount of "energy" received in each segment, and the total energy over all the segments can be obtained as the sum. This total energy is ultimately conserved for any reasonable deformation in the sense that it is all delivered from the deformable mirror 12 to the target profile surface.

Next, a "running integral" algorithm begins in the controller 18. This algorithm numerically integrates the target profile in an incremental way. If the target profile is uniform, this integral value is always the same, and is simply the total energy divided by the number of segments. The numerical integral on the first segment is tested at every increment. If the integral passes the energy value in the first segment of the original profile, a decision is made as to which increment is closest. This becomes a segment break, and in turn the starting value for the next integral. See FIGS. 1D and 1E.

Figure 1F:
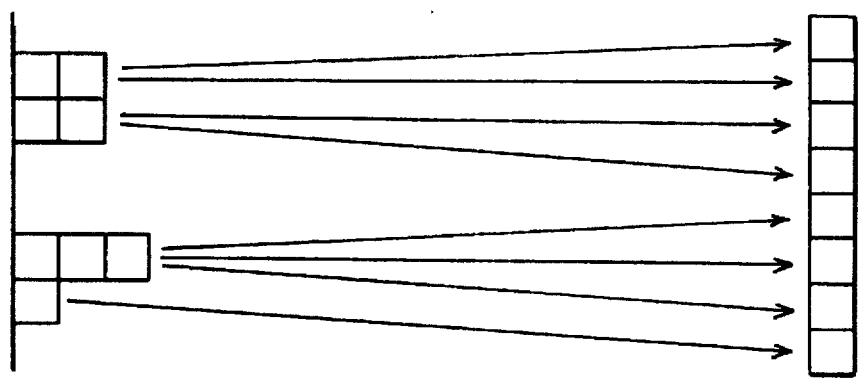
FIG. 1F illustrates profile segment lateral shifting without crossing.
Figure 1G:
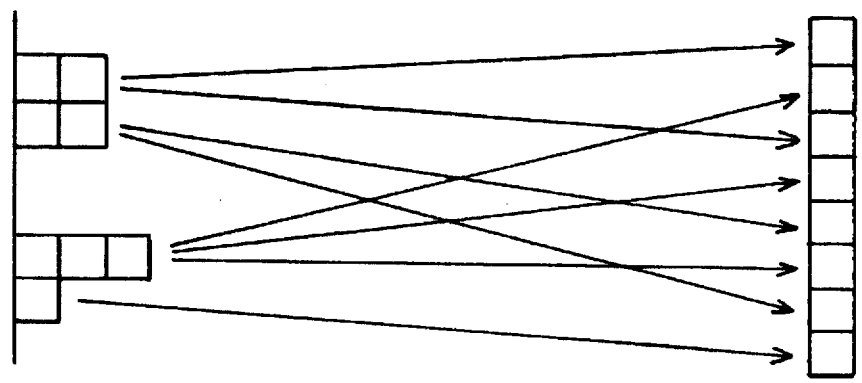
FIG. 1G illustrates profile segment lateral shifting with crossing.
Figure 1H:
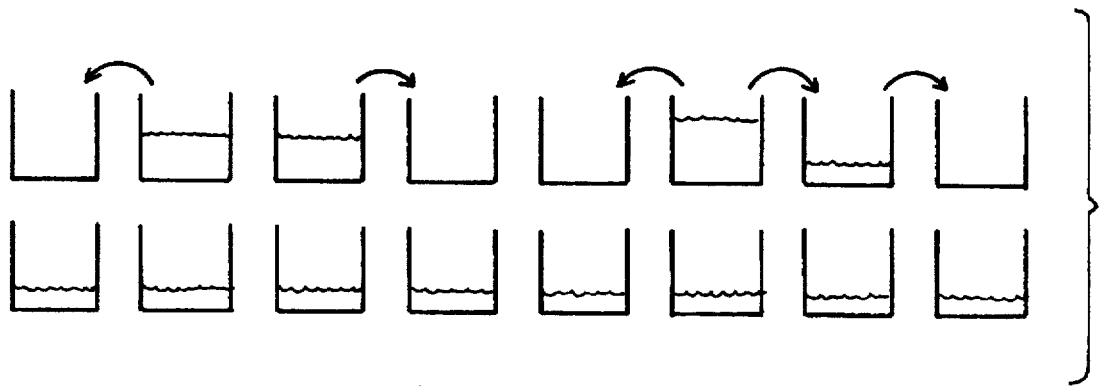
FIG. 1H illustrates a water bucket analogy.

This sequence continues until each source segment of equal length is mated to a target segment of length required to match the energies or area under the curve represented by the data set. As such, the target segment becomes divided into unequal length segments that ultimately stack up or connect sequentially to the proper target size. The stacking procedure inherent in the sequential process assures that energy is shifted the least possible distance. This is shown in FIGS. 1F, 1G, and 1H, and explained by a "bucket brigade" analogy.

Figure 1I:
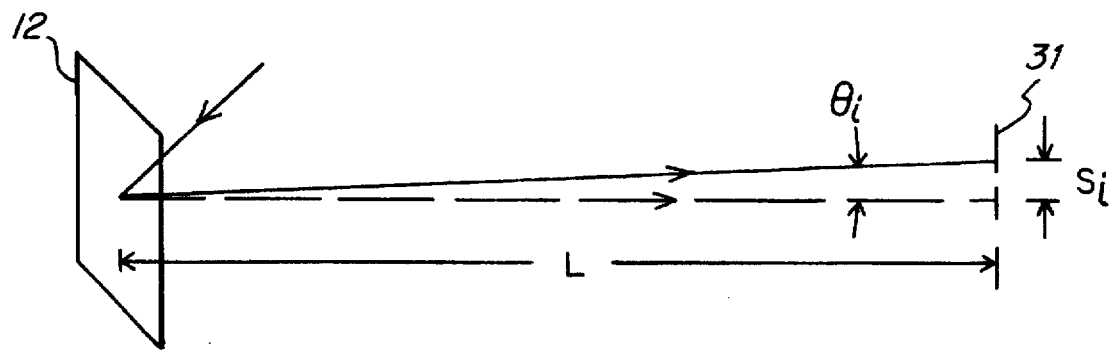
FIG. 1I shows the throw length.
Figure 1J:
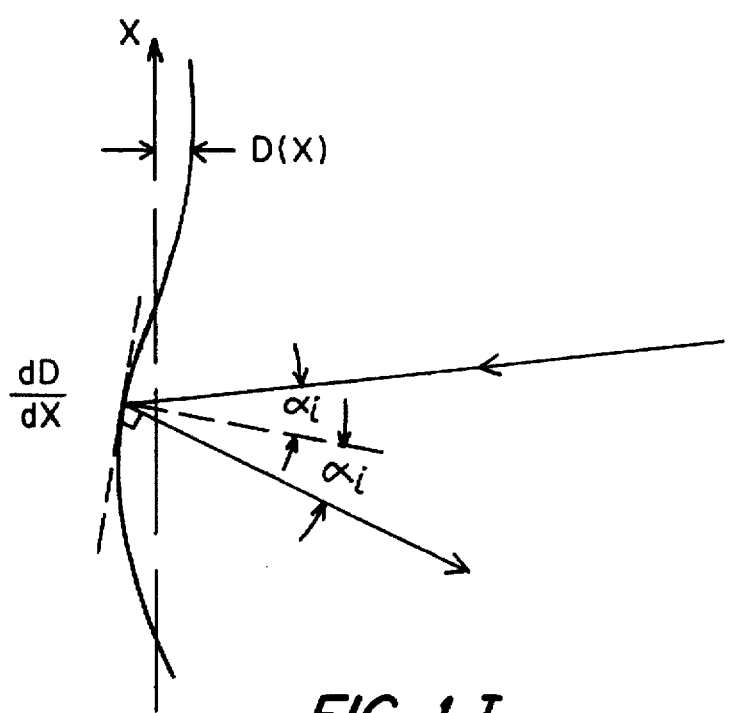
FIG. 1J shows the effect of reflection on the locally sloped mirror surface.

Ultimately, a "ray-shift" angle, shown as $\theta_i$ on FIG. 1I, is derived which represents the required lateral shift, $S_i$ of segment centers occurring at a "throw" length L from the deformable mirror 12 to the substrate 31. Once the angle values are computed, the law of reflection is used to define a surface slope set, and from this the computer algorithm integrates to find a surface displacement function, as illustrated in FIG. 1J. The displacement function will usually be represented by a data set with larger entries than the actual number of actuators. Thus, the actuator control signals are determined as the limited set of displacements which will cause the "glass" of the mirror 12 to closely approximate the mathematical surface. This is done by any standard extrapolation method wherein the actuators 20 are assigned the displacement values that best fit the representation.

Using this type of algorithm, the deformation required for mirror 12 to optimize the illumination profile is minimized because the light is never shifted in a way that results in the crossing rays. This is analogous to a bucket brigade as shown in FIG. 1H. If several buckets were filled with water to arbitrary heights and some new distribution of water were desired, an algorithm can be found to move the water, resulting in the content of any bucket being moved the least distance. Each bucket only gives or receives water from its nearest neighbors and yet ultimately a large amount of water can be moved.

In one embodiment, after the mirror 12 makes more globally uniform the radiation from the illumination source 10, the intensity profile of the radiation is made more locally uniform due to convolution of the illumination profile by the angular spreading nature of diffusive or diffractive optical element(s) as it propagates a short distance to the mask 30. For example, one suitable diffusive or diffractive optical element(s) is a microlens array 22 which can be moved as necessary to eliminate unwanted, microscopic coherent patterns. The microlens array 22 is driven by a quadrature drive 24 in a single plane along the two axes, preferably orthogonal to each other.

The grid size and phase relief of the individual elements of the diffractive element or microlens array 22 will vary depending upon the application. However, the typical element will have individual unit elements in an array. The units are preferably as small as possible. In one embodiment, the individual lens elements of a lens array should be no larger than about 1/1000 times the size of the uniform field.

The diffractive element or microlens array 22 is generally a phase-relief or optical path length modulated element with some repeating base unit. The lateral physical size of this base unit is called the unit size. If the unit is quasi-random or diffuse, then the unit size is the size of the largest lateral dimension over which distinct local properties of the emitted light can be seen. Usually, the unit size will also be the characteristic size of some repeating property of any unwanted coherent pattern or speckle.

In another embodiment, a second microlens array 26 can be located adjacent to the first microlens array 22. This particular approach offers manufacturing ease and affords design flexibility. The second microlens array 26 may be also advantageous in a system having a first microlens array 22 due to magnification of small motions. The two microlens arrays 22, 26, are preferably separated by a distance between 100 and 500 times the focal length of an individual element of the microlens arrays 22, 26. The microlens arrays 22, 26 of this embodiment have been made of a repeating x-y grid of 20 micron wide converging lens whose curvature approximates a desired pupil fill or an angular spread for use in a predetermined photolithographic optical system. A major advantage of this method is the ability to tailor this angular property by the design of the diffractive element. Microlens arrays and other diffractive elements of suitable nature may be purchased from Teledyne Brown Engineering, Huntsville, Ala.

Delimiters 28 are placed at or near the target plane or mask 30. The delimiters 28 help to prevent unwanted radiation from reaching the target plane, at the mask 30 or substrate 31. The globally and locally uniform illumination profile is projected through the reticle or mask 30 to projection optics 29. Two suitable projection optics systems are described in U.S. Pat. No. 4,953,960, entitled, *Color Corrected Optical Reduction System Using One Material*, and U.S. application Ser. No. 08/009,284, entitled, *High Numerical Aperture Catadioptric Reduction Lens*, the disclosures of which are hereby incorporated by reference.

Figure 1K:
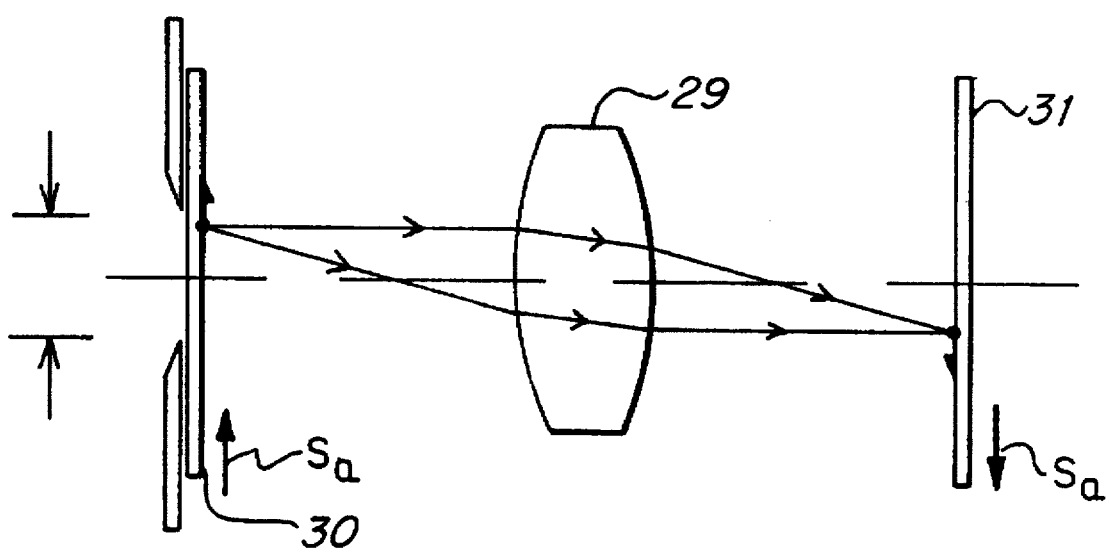
FIG. 1K shows scanning of a reticle and wafer.

The projection optics 29 image the reticle or mask 30 onto the substrate 31. The mask 30 and substrate 31 may be scanned in accurate conjugation along a scan axis, represented by arrows $S_a$, as shown in FIG. 1K. This makes possible the imaging of a reticle or mask 30 onto a substrate 31 that is larger than the illumination or imaging field. It also favors a one-dimensional mirror deformation.

Figure 1L:
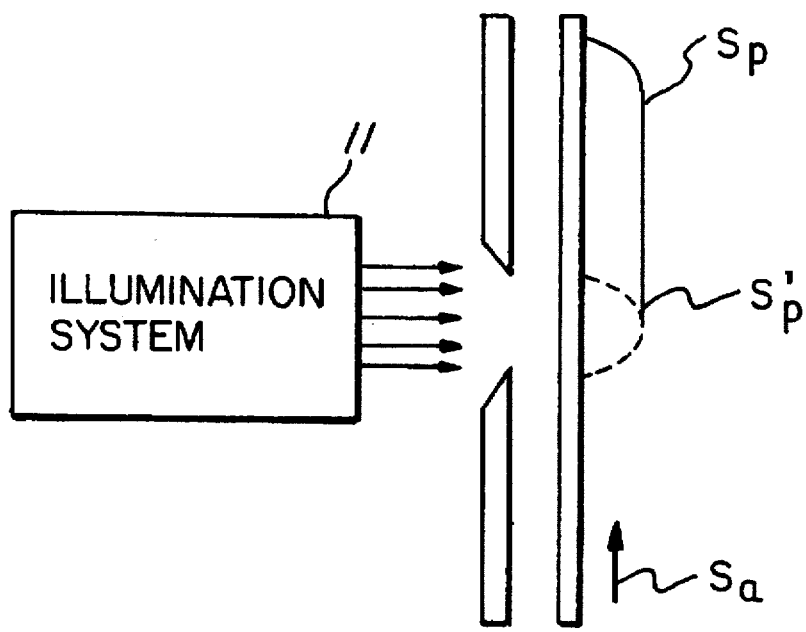
FIG. 1L shows the way a uniform profile is created.

Scanning microlithography exposure systems have the advantage that precise imaging can be obtained when the object is moving and the image-forming surface is moving in accurate conjugation. The projection optics 29 (i.e., lens) and the illumination source 10 are fixed. The projection optics 29 at any instant images only a section of the full reticle or mask 30 object, within a rectangular field stop referred to as the "slot". This "slot" must be appropriately illuminated and uniform in the non-scan direction. The illumination profile in the scan direction is noncritical as long as an adequate number of pulses are used during the scan across the slot width, because the illumination profile is essentially smeared into a uniform profile by the scan. FIG. 1L illustrates the uniform scan profile $S_p$ and the non-uniform slot profile $S'_p$ created by an illumination system 11.

Figure 2:
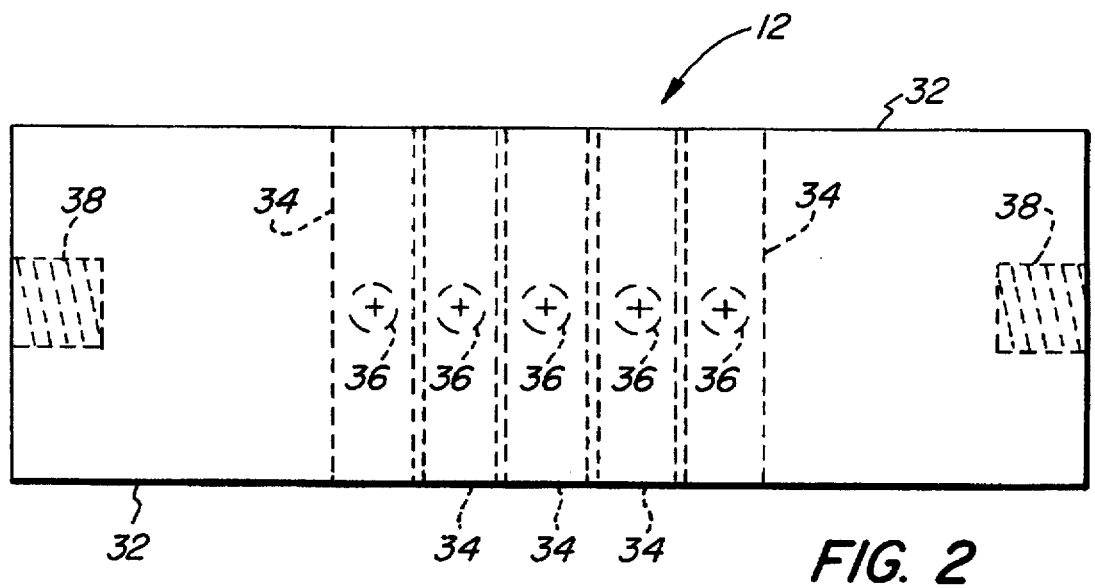
FIG. 2 is a plan view of a first embodiment of the deformable mirror illustrated in FIG. 1.

FIG. 2 illustrates a one-dimensional deformable mirror 12. The mirror 12 surface departs from some basis surface only along one cross-section. A one-dimensional deformable mirror 12 may be adequate for use in a scanning photolithography system. The deformable mirror 12 has a flexible or deformable mirrored surface 32. Beneath the surface 32 are a plurality of actuators 34. The actuators 34, in this example, are moved by threaded shafts or screws 36. Mounting threads 38, in either end of deformable mirror 12, are used to mount the deformable mirror 12 in the beam delivery or illumination system chassis.

Figure 3:
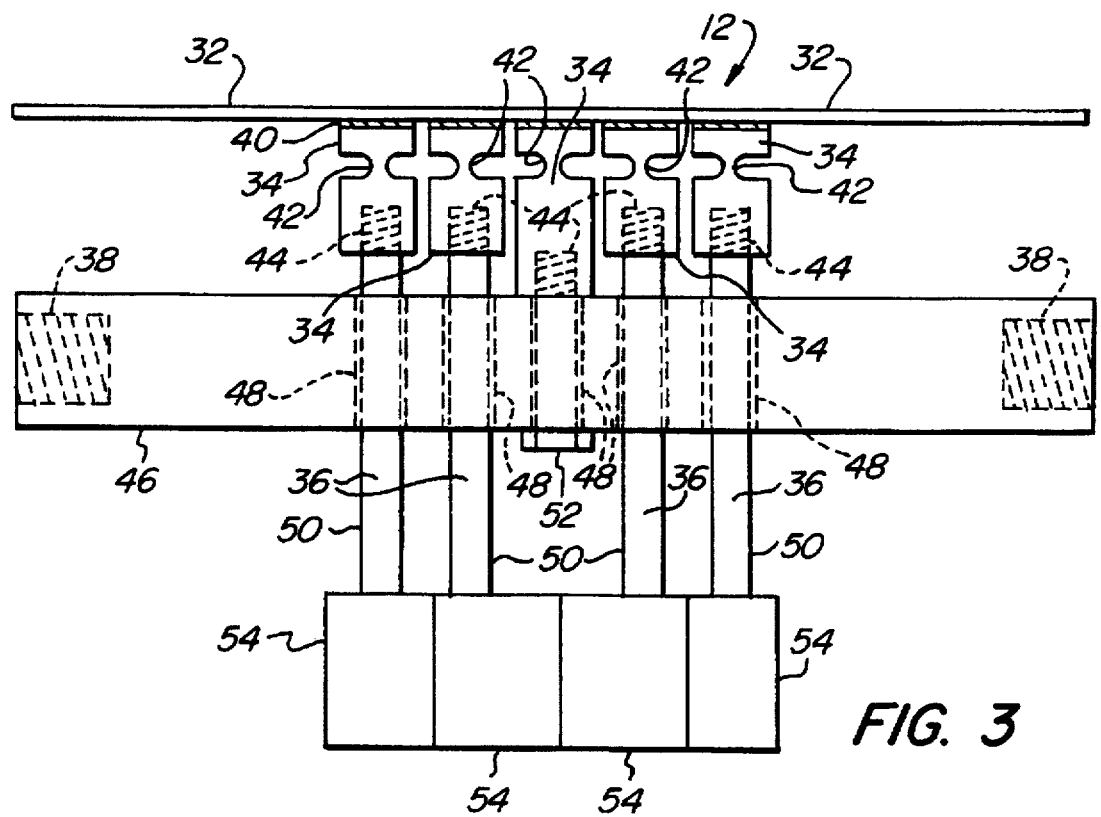
FIG. 3 is a front elevational view of the deformable mirror illustrated in FIG. 2.

FIG. 3 illustrates the relationship of the deformable mirror 12 and the actuators 34. Each of the actuators 34 are bonded with an adhesive 40 to the surface 32. One suitable adhesive is 3M Part No. 2216 which can be purchased from the Minnesota Mining and Manufacturing Company, St. Paul, Minn. The actuators 34 include a flexure cut 42 to define a virtual point of applied load and relieve lateral loading. Within each actuator 34 is a threaded hole 44. A threaded shaft 36 is screwed into each threaded hole 44. Support or guide 46 has a plurality of bores 48 therein. Each bore 48 has a diameter slightly greater than the outside diameter 50 of the corresponding threaded shaft 36. The center actuator 34 is held in a fixed position by a bolt 52. The shafts 36 are moved by drives 54. The drives 54 can either rotate the threaded shafts 36 or move up and down without rotation, thereby causing the actuators 34 to move.

As discussed earlier, the controller 18 selectively controls the drives 54 to achieve the lowest necessary amount of deformation needed to obtain the required globally uniform intensity profile. By using the throw distance (i.e., optical propagation without imaging) from the deformable mirror 12 to the target plane or reticle 30, illustrated in FIG. 1, of about 1 meter, only about a 1 radian local angular deformation of the flexible surface 32 is typically needed. This is well within the acceptable range of motion of a thin reflective substrate of about 1 millimeter thickness. Additionally, with the small angular deformation there is little decollimation. The decollimation is too slight to effect the desirable telecentric properties of radiation emanating from the microlens arrays 22 and 26, illustrated in FIG. 1, and in turn yields acceptably small distortion of images which are slightly defocused.

Figure 4:
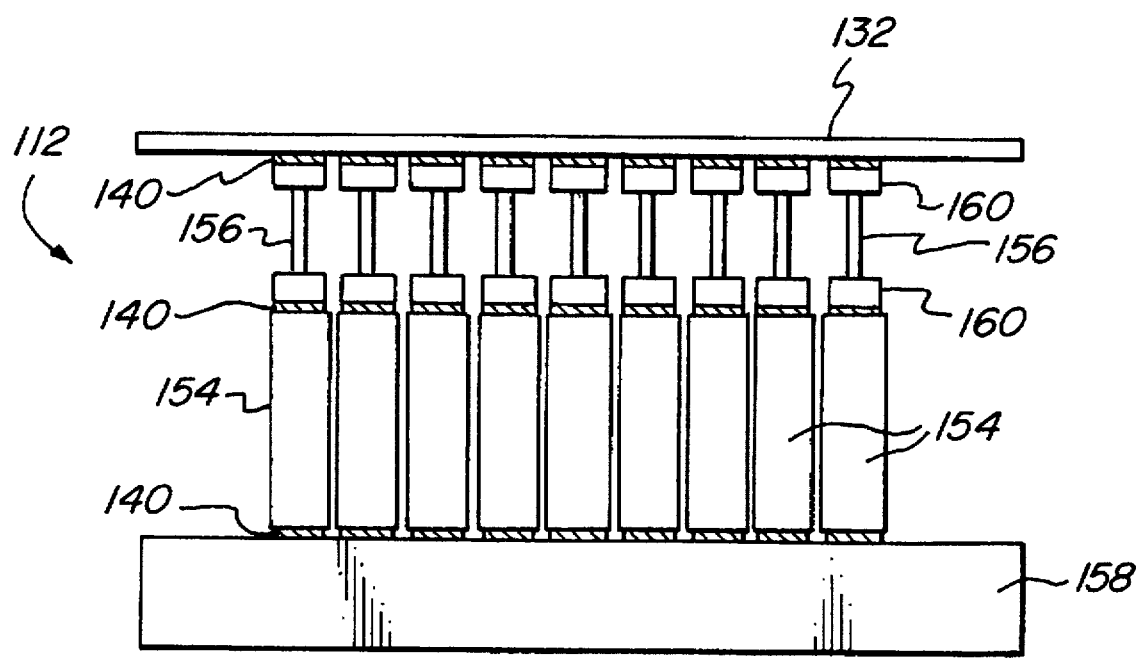
FIG. 4 is a front elevational view of a second embodiment of the deformable mirror illustrated in FIG. 1.
Figure 5:
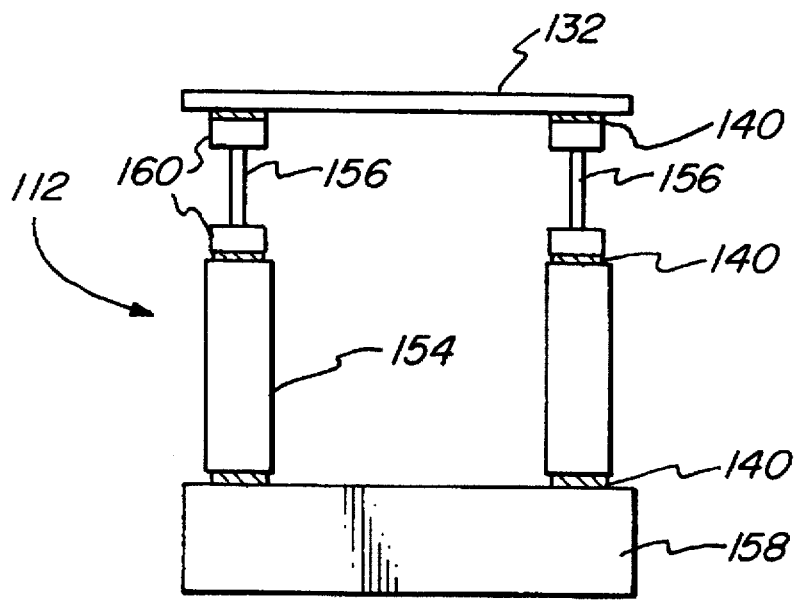
FIG. 5 is a side elevational view of the second embodiment of the deformable mirror illustrated in FIG. 4.

FIGS. 4 and 5 illustrate a second embodiment of the deformable mirror schematically illustrated in FIG. 1. The deformable mirror 12 of the second embodiment is similar to the first embodiment depicted in FIG. 3. However, this second embodiment has two rows of piezoelectric transducer actuators 154 and wire flexures 156.

In FIG. 4, the mirror 132 is attached to piezoelectric transducer actuators 154 by wire flexures 156 placed between supports 160. Suitable piezoelectric transducers may be obtained from AVX Corporation, Conway, S.C. One suitable transducer is AVX Model No. C3.50010-C. The piezoelectric transducer actuators 154 are attached to a base 158. The back of the mirror 132, supports 160, actuators 154 and base 158 are bonded together with an adhesive 140 such as 3M Co. Part No. 2216. The piezoelectric transducer actuators 154 are only required to controllably move the reflective surface of the deformable mirror 132 less than 10 microns from the undeformed state to obtain the desired global illumination uniformity.

FIG. 5 illustrates two rows of piezoelectric transducer actuator 154 assemblies used to deform the mirror surface 132. The placement of a row of piezoelectric transducer actuator 154 assemblies at each longitudinal edge of the mirror surface 132 helps eliminate unwanted torsional deformation of the mirror 132. The wire flexures support and strain the mirror in a desirable one-dimensional manner while relieving unwanted lateral strain.

Figure 6:
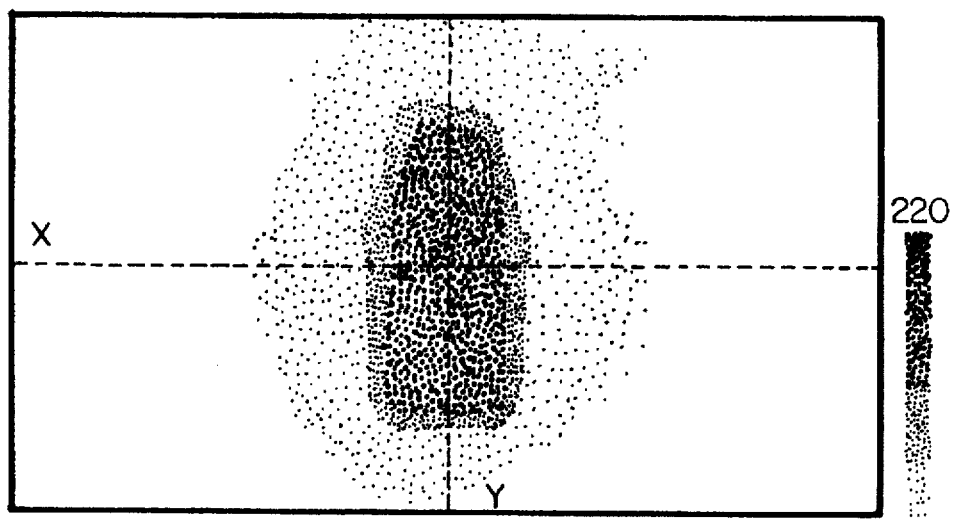
FIG. 6 is a graph illustrating the illumination profile from a laser source.

FIG. 6 illustrates the illumination profile of an uncorrected excimer laser. The relative intensity of the radiation is represented by the shading in the graph of FIG. 6. The darker areas indicate greater radiation intensity.

Figure 7:
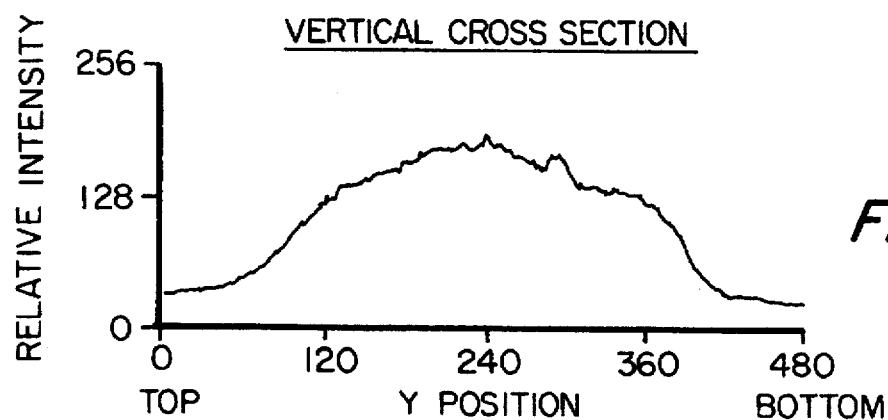
FIG. 7 is a graph illustrating the illumination intensity along the y-axis in FIG. 6.

FIG. 7 illustrates the radiation intensity along the cross-section of the y-axis in FIG. 6. It can clearly be seen that the relative intensity varies considerably with respect to a change along the y-axis. This effect exists even over a central portion of the curve.

Figure 8:
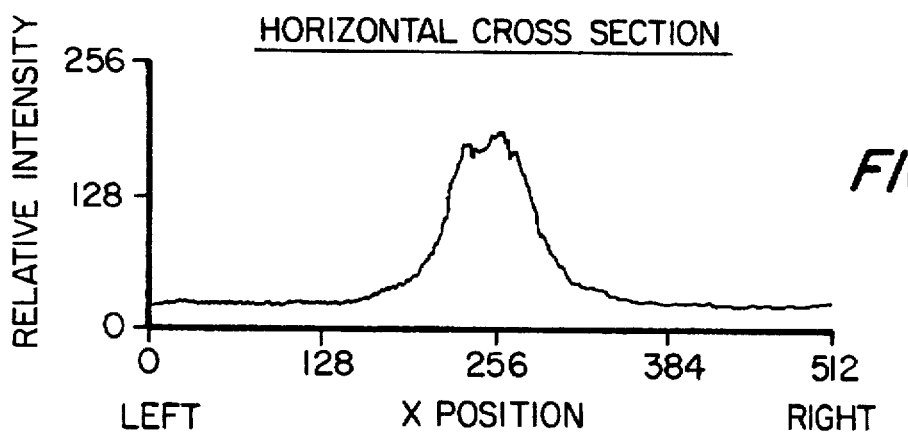
FIG. 8 is a graph illustrating the illumination intensity along the x-axis illustrated in FIG. 6.

FIG. 8 illustrates the intensity of radiation along the x-axis in FIG. 6. The illumination along the x-axis has been found to be relatively stable and predictable for an ArF excimer laser. Further, this axis, which is parallel to the scan axis or direction of scan, when used in a scanning system is less critical in obtaining a uniform exposure. The y-axis, which is perpendicular to the scan axis or direction of scan, is more critical and has been found more susceptible to fluctuation. This fluctuation or laser deterioration over time is due to changes in the alignment, optics quality, gas quality, discharge dynamics, and temperature, among other variables.

Figure 9:
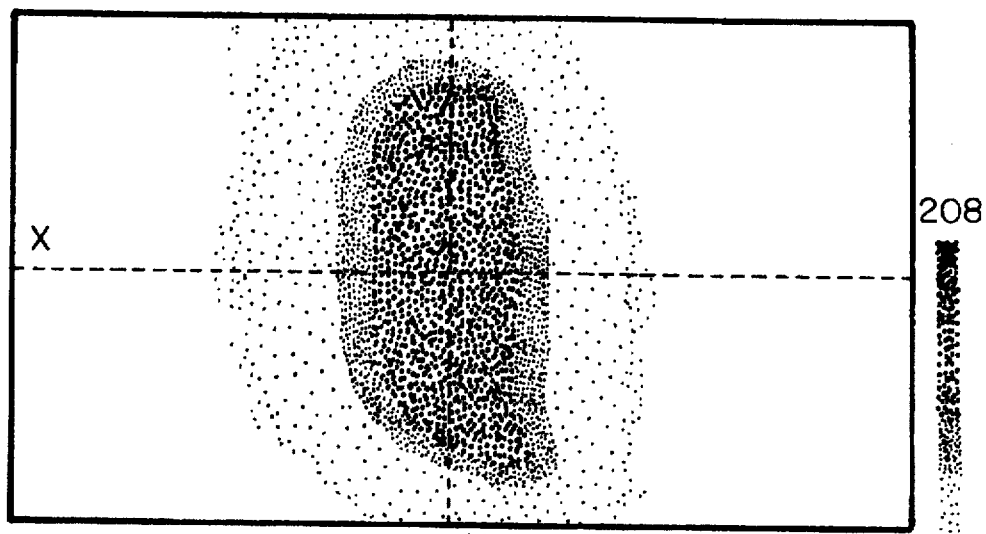
FIG. 9 is a graph illustrating an illumination profile of a laser source corrected by the present invention.
Figure 10:
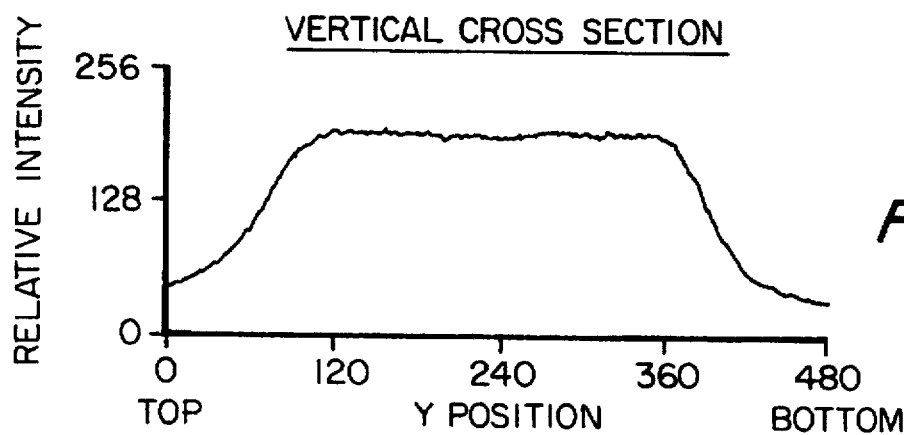
FIG. 10 is a graph illustrating the illumination intensity along the y-axis of FIG. 9.
Figure 11:
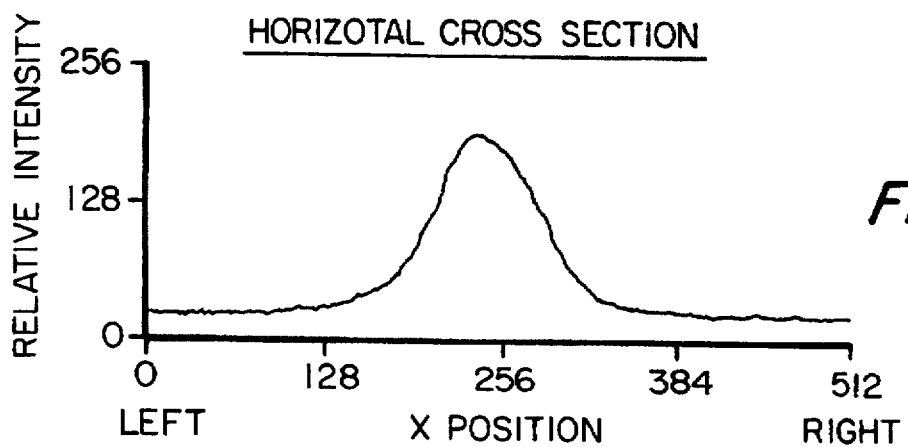
FIG. 11 is a graph illustrating the illumination intensity along the x-axis of FIG. 9.

FIGS. 9–11 are similar to those found in FIGS. 6–8. However, the graphs in FIGS. 9–11 illustrate the illumination intensity that results from the application of the present invention to the same laser source as illustrated in FIGS. 6–8. The uniformity of the illumination intensity along the critical y-axis is greatly improved. This can be illustrated by the substantially flat central portion of the curve in FIG. 10. Therefore, a larger portion of the originally poor profile of the illumination source is made available.

FIG. 10 illustrates a flat central portion of the illumination intensity curve that is very desirable in obtaining a uniform exposure during a scanning operation. In practice with a scanning exposure system, the profile sensor and/or signal processing should display the profile along y resulting from averaging over x. In so doing, the data is made to represent the averaging action of a scan, as shown in FIG. 1C. The flat central portion of the illumination intensity curve achieved with the present invention has been found to vary less than 1%.

Figure 12:
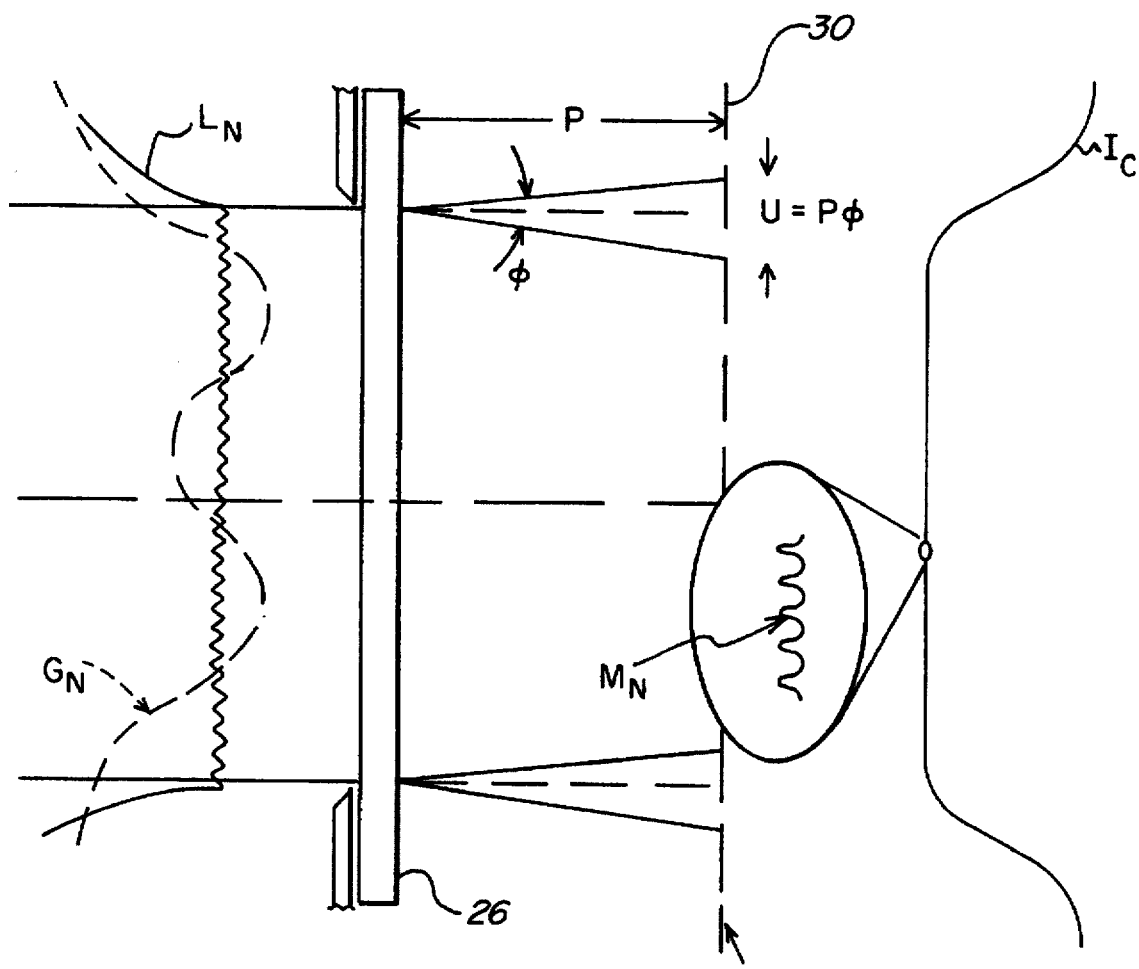
FIG. 12 illustrates global, local, and microscopic uniformity scales and profile convolving geometry.

Three different spatial size categories apply to uniformity definitions as global, local, or microscopic. "Global" refers to roughly the size of the illuminated field and a lateral extent larger than the extent of profile convolving by the propagation action of the diffractive element. The mirror deformation essentially only acts on this definition of uniformity. The "ripple" or fine structure not fully corrected by deformation is a "local" nonuniformity that gets removed by the convolving effect. This leaves only "speckle" or unwanted "microscopic" interference patterns which are removed through the motion of the diffractive element during a many-pulse dose. These are all illustrated in FIG. 12. In FIG. 12, line $G_N$ represents the "global" non-uniformity, line $L_N$ represents the "local" non-uniformity, and line $M_N$ represents the "microscopic" non-uniformity. Line $I_C$ represents the illumination profile.

Referring again to FIG. 1, the microlens array or array pair 22 act as an angularly tailored diffuser. The diffractive element(s) or microlens array pair 22 act by local mixing like a low band pass filter of the frequencies of the spatial pattern. This removes fine structure flaws in the profile as seen at the reticle or mask 30. Since the cut-off is a function of the distance to the plane of observation, it can be thought of as a tunable filter. The averaging by convolution of the fine structure is a function of distance.

It is preferred that microlens array 26 be physically close to the delimiter plane 28. For example, in one embodiment, the last or second microlens array 26 is approximately 10 millimeters from the delimiter plane 28. However, in other embodiments, the microlens array 26 position can vary considerably from this amount depending on the application. The distance is typically established such that several hundred array units project light angularly upon any uniform field point.

When the projection optics 29 of the photolithographic system has a pupil at infinity, the pupil fill, and hence angular behavior of radiation at the reticle, comes from the far-field (e.g., infinite distance) diffraction pattern of the microlens arrays 22, 26. The far field pattern is characterized by divergence with negligible change in shape as the pattern propagates. Because of the very large number of lenses in the microlens arrays 22, 26, all reticle points essentially see the same angular distribution of secondary sources. Therefore, a condenser is not needed to reimage secondary illumination source or microlens array 26 on the pupil, as is typical of a conventional "Kohler" illuminator design.

When a coherent radiation source such as a laser source 10 is used, a stable interference pattern sometimes called "speckle" occurs in the plane of reticle or mask 30. This unwanted pattern is the near field diffraction pattern of the diffusive or diffractive elements or microlens arrays 22, 26. The phase correlated contributions at any point in the reticle plane 30 will create a highly visible fringe pattern in a static coordinate system associated with the microlens arrays 22, 26. This is an unwanted feature overlaying the desired circuit feature image.

Figure 14:
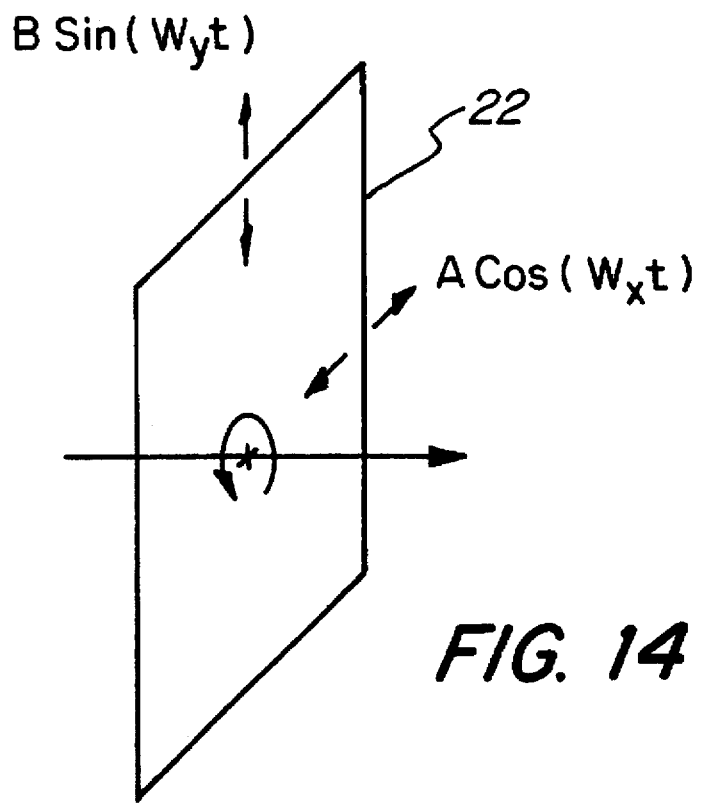
FIG. 14 illustrates circular motion in a transverse plane caused by the gyration of the diffractive element.
Figure 15:
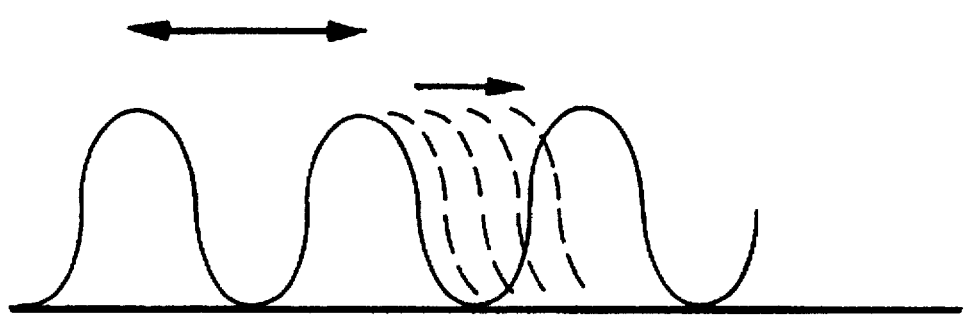
FIG. 15 illustrates the effect of the gyration of the diffractive element.

For pulsed beam sources, energy instability typically requires the use of at least 30 pulses, resulting in a summed dose. The pulse summing offers two ways to eliminate the unwanted interference pattern in the summed dose over time. The first is to move the diffusive or diffractive element to cause the interference pattern to move about one unit distance across itself two-dimensionally resulting in a sum dose absent of the interference pattern. A second is to shift the incident angle of the coherent wavefronts at the diffusive element 22 in a way that creates a changing linear phase shift function and thus the same pattern motion. This eliminates the unwanted pattern. FIGS. 14 and 15 show the nature of this motion, with FIG. 15 illustrating the speckle pattern washout resulting from the motion.

Coherent radiation sources, such as lasers display the problem of speckle, that is, unwanted images created by localized nonuniformity in the illumination source due to interference. For an excimer laser, speckle cannot be eliminated without moving elements unless a scheme is used to create efficient cross mixing of the incoherent zones of the beam as might be done with a condenser lens. The invention does not require a condenser lens to eliminate speckle, is thus simpler and involves less transmission loss. The diffractive element 22 moves in quadrature along two orthogonal axes in a single plane (FIG. 12). This circulating motion of microlens array 22 avoids the possibility that a vector of the motion could lie in an accidental symmetry axis.

Figure 13:
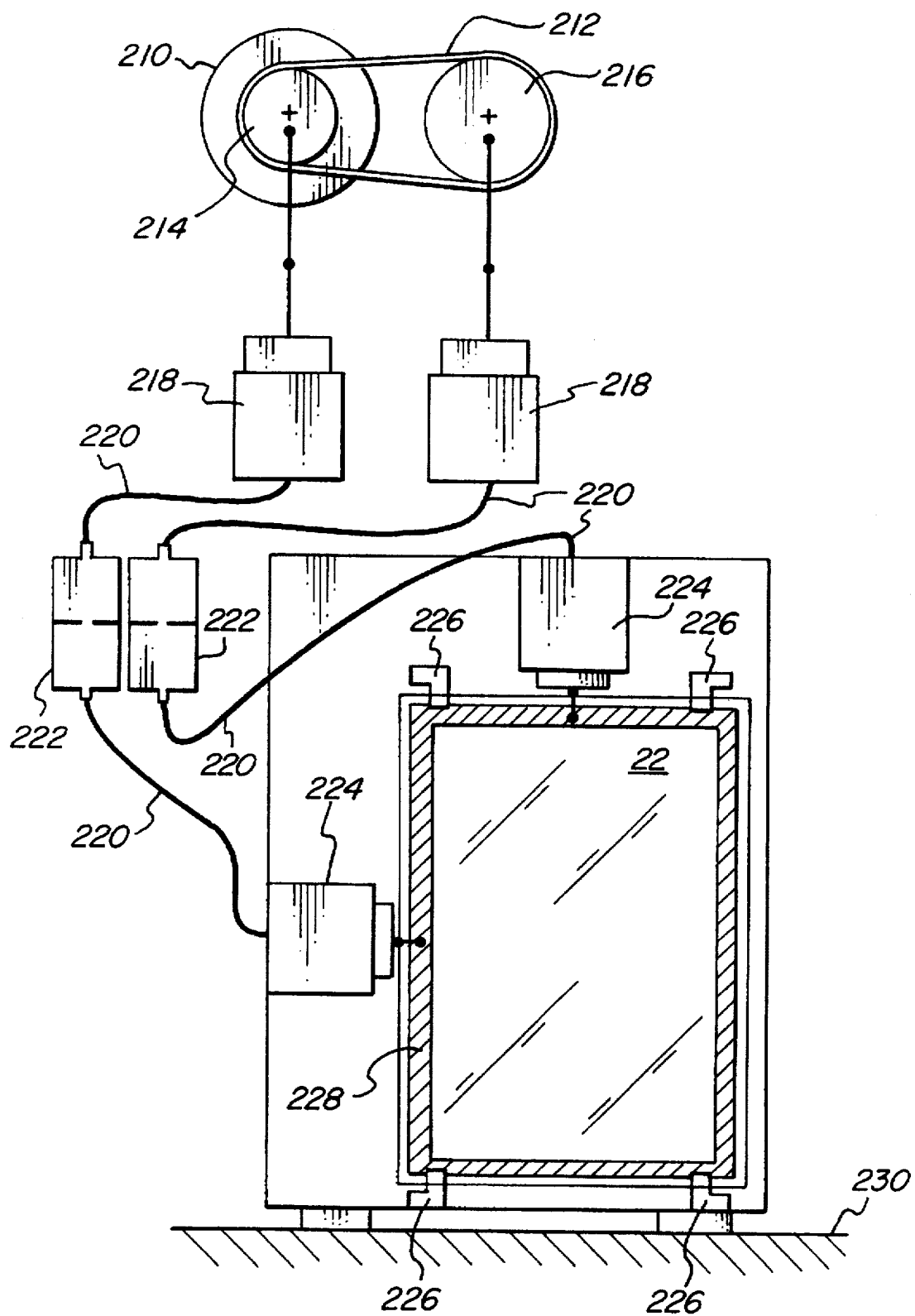
FIG. 13 shows one possible way to gyrate the diffractive element.

The movement of the microlens array 22 by quadrature drive 24 is preferably caused by small motion, low inertia actuators acting in quadrature and driven pneumatically by a remote motorized actuator system as shown in FIG. 13. In FIG. 13 a motor 210 drives a first wheel 214 and a second wheel 216 by a belt 212. The wheels 214 and 216 in turn drive pneumatic compressors 218 which feed pneumatic hoses 220. The pnumatic pressure and flow is controlled by attenuators 222. The pnumatic pressure and flow is used to drive two pneumatic actuators 224 in quadrature. Each of the drives 224 is attached to a frame 228 which holds the diffractive element or microlens array 22. The frame is held by flexures 226 and supported by support 230. This eliminates unnecessary vibration. The resultant motion in the single plane may be random. The pneumatic actuators 224 coupled to the microlens array 22 are driven by a drive motor 210 some distance away. The movable microlens array 22 is compact and has very small inertial mass. Additionally, the stroke of the pneumatic actuators 224 can be easily changed by pressure drop methods without changing the frequency. Thus speckle is eliminated with the smallest stroke possible. Generally, the movement required in the diffractive or diffusive element or microlens array 22 is very small, usually 20 microns or less. This small motion reduces the possibility of introducing undesirable vibration in a photolithographic system.

The deformable mirror 12 is adjusted in accordance with changes in the illumination profile from the source 10. The change in the illumination profile from the source 10 is not rapid and is relatively stable over a short period of time, i.e., the time needed to expose several wafers. Therefore, when used with an excimer laser the deformable mirror 12 need only be adjusted upon initial start-up of the source 10 or when the output of the source 10 has changed, as detected by the sensing means. The deformable mirror actuators 20, do not need to be respond that fast. Additionally, it has been determined that only approximately seven one-dimensional actuators 34, illustrated in FIGS. 2–3, are needed to obtain the desired uniform illumination profile within ±1% over the desired field.

Figure 16:
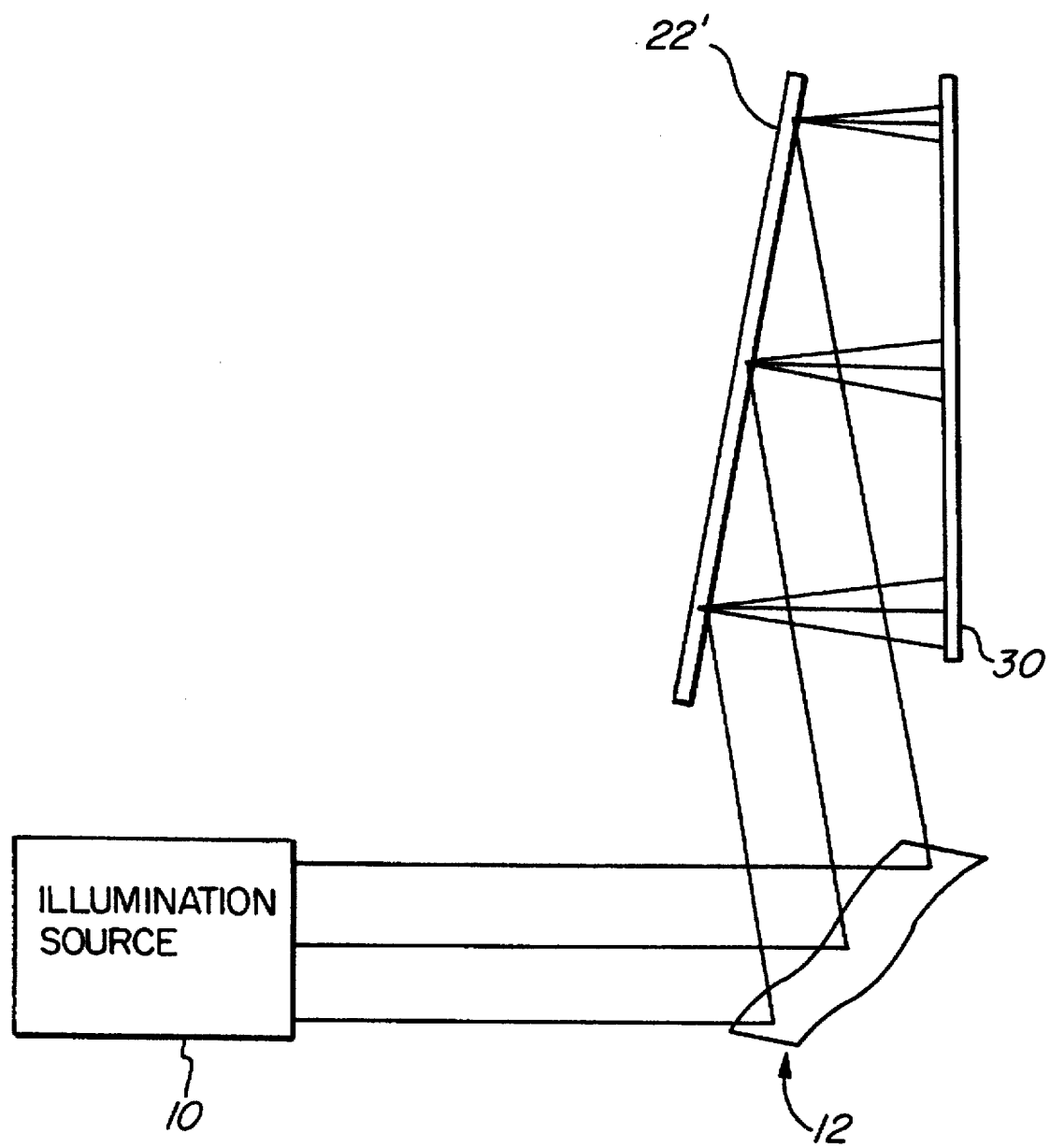
FIG. 16 illustrates another embodiment of the present invention using a reflective diffractive element.

FIG. 16 illustrates another embodiment of the present invention. In FIG. 16 a reflective diffractive element 22' is used. The reflective diffractive element 22' reflects electromagnetic radiation received from deformable mirror 12 onto the reticle 30. The reflective diffractive element 22' is oriented in such a way so as to cause the illuminated reticle field to occur in reflection, including specular reflection, diffuse reflection, or any arbitrary angle of reflection attributed to the ability of the diffracting features to generate desired properties of radiation at specific angular locations on the incident side of the reflective diffractive element 22'.

Accordingly, it should be readily appreciated that the present invention can provide a dramatic improvement in illumination profile uniformity. Additionally, the effects of speckle that result from the use of a coherent radiation source are eliminated. This is accomplished with a simple design that is inexpensive and has very low transmission losses. Suitable materials and coatings for short wavelength sources are used for a very small number of elements traversed by the beam. As a result, more uniform illumination profiles can be obtained from the same power illumination source than previously possible.

The term diffractive element or diffractive optical element used throughout this disclosure is meant to mean any element whose effect on an incident electromagnetic radiation field is dominated by the diffraction theory of radiation, and inadequately specified by ray-refractive or geometric models or analyses. The category includes substrates or elements of transmissive or reflective materials having amplitude and/or phase modulation or patterns which generate distinct amplitude, phase, and intensity patterns at specified fields or spacial positions. The current description emphasizes elements used in transmission, but reflective embodiments of the same nature are included, for example the embodiment illustrated in FIG. 16. Similarly, a diffusive element is defined as any element whose effect on a substantially directional or beam-like radiation field is to reduce it's directional nature to some degree by generating the effect of a large number of apparent secondary radiation sources. Such a diffusive element may be considered a member of the category of diffractive elements as defined herein.

Although the preferred embodiment has been illustrated and described, it will be obvious to those skilled in the art that various modifications may be made without departing from the spirit and scope of this invention. While one preferred embodiment has been described with an excimer laser source, the illumination system may be applied to other illumination sources, and preferably, a substantially directional radiation source, with appropriate materials employed for the deformable mirror coating and diffusive elements.

What is claimed is:

1. An illumination system for use in lithography, comprising:

a source of electromagnetic radiation;

a deformable mirror;

actuator means, coupled to the deformable mirror, for changing the surface contour of the deformable mirror;

profile sensing means for determining an intensity profile of radiation emitted from the source;

controller means, associated with the profile sensing means and the actuator means, for calculating a surface contour for the deformable mirror and controlling the actuator means; and a diffusive or diffractive optical element placed adjacent an illumination plane providing a desired illumination profile to a reticle, whereby radiation from the source is reflected from the deformable mirror and through the diffusive or diffractive optical element resulting in improved global and local radiation intensity uniformity.

2. The illumination system of claim 1, wherein the diffusive or diffractive optical element is movable.

3. The illumination system of claim 1, wherein the diffusive or diffractive optical element is movable in a single plane.

4. The illumination system of claim 1, wherein the diffusive or diffractive optical element is made of a plurality of lenses.

5. The illumination system of claim 4, wherein each of the plurality of lenses is 20 or less microns wide.

6. The illumination system of claim 1, wherein the deformable mirror is deformable primarily in one dimension.

7. The illumination system of claim 1, further comprising a plurality of independent actuators attached to the deformable mirror.

8. The illumination system for use in photolithography as in claim 7, wherein the number of the plurality of independent actuators is large enough to cause the surface to obtain contours that are neither flat nor spherical.

9. The illumination system of claim 1, wherein the diffusive or diffractive element is placed sufficiently close to the illumination plane to obtain illumination within the near field diffraction pattern.

10. An illumination system for use in lithography, comprising:
   a source of electromagnetic radiation;
   a deformable mirror;
   actuator means, coupled to the deformable mirror, for changing the surface contour of the deformable mirror;
   profile sensing means for determining an intensity profile of radiation emitted from the source;
   controller means, associated with the profile sensing means and the actuator means, for calculating a surface contour for the deformable mirror and controlling the actuator means; and
   diffusive or diffractive optical element, wherein the diffusive or diffractive optical element is a microlens array having individual lens elements of a size no larger than $1/1000$ times the size of the desired uniform field,
   whereby radiation from the source is reflected from the deformable mirror and through the diffusive or diffractive optical element resulting in improved global and local radiation intensity uniformity.

11. The illumination system of claim 10, further comprising a second microlens array placed adjacent the first microlens array.

12. The illumination system of claim 11, wherein one of the first and second microlens arrays is movable.

13. An illumination system for use in lithography, comprising:
   a source of electromagnetic radiation;
   a deformable mirror;
   actuator means, coupled to the deformable mirror, for changing the surface contour of the deformable mirror;
   profile sensing means for determining an intensity profile of radiation emitted from the source;
   controller means, associated with the profile sensing means and the actuator means, for calculating a surface contour for the deformable mirror and controlling the actuator means; and
   a diffusive or diffractive optical element, wherein the diffusive or diffractive optical element moves less than one unit size in a lateral plane during exposure,
   whereby radiation from the source is reflected from the deformable mirror and through the diffusive or diffractive optical element resulting in improved global and local radiation intensity uniformity.

14. An illumination system for use in lithography, comprising:
   a source of electromagnetic radiation;
   a deformable mirror;
   actuator means, coupled to the deformable mirror, for changing the surface contour of the deformable mirror;
   profile sensing means for determining an intensity profile of radiation emitted from the source;
   controller means, associated with the profile sensing means and the actuator means, for calculating a surface contour for the deformable mirror and controlling the actuator means; and
   a diffusive or diffractive optical element,
   wherein the actuator means further comprises:
      a first row of wire flexures attached along a first longitudinal edge of the deformable mirror;
      a second row of wire flexures attached along a second longitudinal edge of the deformable mirror;
      a first row of actuators attached to the first row of wire flexures;
      a second row of actuators attached to the second row of wire flexures; and
      the first and second rows of actuators attached to a base, and
      the first and second row of actuators are controlled by the controller means for deforming the deformable mirror,
   whereby radiation from the source is reflected from the deformable mirror and through the diffusive or diffractive optical element resulting in improved global and local radiation intensity uniformity.

15. The illumination system of claim 14, wherein each actuator in the first and second rows of actuators has a range of motion of less than 10 microns.

16. The illumination system of claim 15, wherein each actuator in the first and second rows of actuators is a piezoelectric transducer.

17. An illumination system for use in photolithography, comprising:
   a laser or radiation beam source;
   a deformable mirror;
   actuator means, associated with the deformable mirror, for changing the surface contour of the deformable mirror;
   profile sensing means for determining an intensity profile of radiation emitted from the laser source;
   controller means, associated with the profile sensing means and the actuator means, for calculating a surface contour for the deformable mirror and controlling the actuator means; and
   a first microlens array placed adjacent an illumination plane providing a desired illumination profile to a reticle,
   whereby radiation from the laser source is reflected from the deformable mirror and through the first microlens array resulting in improved global and local radiation intensity uniformity.

18. A laser illumination system for use in photolithography having an object and image plane, comprising:

a laser source;

a deformable mirror;

actuator means, associated with the deformable mirror, for changing the surface contour of the deformable mirror, the actuator means capable of deforming the surface of the deformable mirror at any one location;

profile sensing means for determining an intensity profile of radiation emitted from the laser source;

controller means, associated with the profile sensing means and the actuator means, for calculating a surface contour for the deformable mirror and controlling the actuator means;

a first movable microlens array having a range of motion along two axes in a single plane of less than 20 microns; and a second microlens array positioned near the first microlens array, the second microlens array placed sufficiently close to a target plane to obtain illumination within the near field diffraction pattern, whereby radiation from the laser source is reflected from the deformable mirror and through the first and second microlens arrays resulting in improved global and local radiation intensity uniformity.

19. An illumination system as in claim 1, 10, 11, 9, 17, or 18, wherein said diffractive or diffusive element or microlens array has behavior dominated by diffraction of radiation and is inadequately determined by ray or refractive models or analyses.

20. An illumination system as in claim 19, wherein said diffractive or diffusive element or microlens array may include any substantially planar optical surface with phase relief or optical path modulation, with either stepwise or continuous character.

21. An illumination system for use in lithography, comprising;

a source of electromagnetic radiation;

a deformable mirror;

actuator means, coupled to the deformable mirror, for changing the surface contour of the deformable mirror;

profile sensing means for determining an intensity profile of radiation emitted from the source;

controller means, associated with the profile sensing means and the actuator means, for calculating a surface contour for the deformable mirror and controlling the actuator means; and a diffusive or diffractive optical element, wherein said diffractive or diffusive optical element is reflective, and whereby the radiation from the source of electromagnetic radiation is reflected rather than transmitted through the diffractive or diffusive optical element resulting in improved global and local radiation intensity uniformity.

22. An illumination system for use in lithography, comprising:

a source of electromagnetic radiation;

a deformable mirror;

an actuator, said actuator coupled to the deformable mirror and capable of changing the surface contour of the deformable mirror;

a profile sensor, said profile sensor capable of determining an intensity profile of radiation emitted from the source;

a controller, said controller coupled to said profile sensor and said actuator, said controller capable of calculating a surface contour for said deformable mirror and controlling the actuator; and a first diffusive or diffractive optical element placed adjacent an illumination plane, whereby radiation from said source is reflected from said deformable mirror and through said first diffusive or diffractive optical element resulting in improved global and local radiation intensity uniformity.

23. An illumination system as in claim 22 further comprising:

a second diffusive or diffractive optical element placed adjacent said first diffusive or diffractive optical element.

* * * * *